United States Patent
Lee et al.

(10) Patent No.: US 10,515,670 B1
(45) Date of Patent: Dec. 24, 2019

(54) MEMORY APPARATUS AND VOLTAGE CONTROL METHOD THEREOF

(71) Applicant: NANYA TECHNOLOGY CORPORATION, New Taipei (TW)

(72) Inventors: Wen-Ming Lee, Miaoli County (TW); Chuan-Jen Chang, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/006,871

(22) Filed: Jun. 13, 2018

(51) Int. Cl.
*G11C 5/14* (2006.01)
*G06F 1/08* (2006.01)
*H03L 7/08* (2006.01)

(52) U.S. Cl.
CPC .............. *G11C 5/147* (2013.01); *G06F 1/08* (2013.01); *H03L 7/08* (2013.01)

(58) Field of Classification Search
CPC .............. G11C 5/147; G06F 1/08; H03L 7/08
USPC ........................................................ 365/227
See application file for complete search history.

(56) References Cited

U.S. PATENT DOCUMENTS

| | | | |
|---|---|---|---|
| 5,420,528 A * | 5/1995 | Shigehara | G11C 7/00 326/98 |
| 6,845,457 B1 | 1/2005 | Mirov et al. | |
| 7,849,339 B2 | 12/2010 | Lee | |
| 2010/0277990 A1* | 11/2010 | Kenkare | G11C 5/147 365/189.011 |
| 2014/0184292 A1* | 7/2014 | Lin | H03K 5/1565 327/175 |

OTHER PUBLICATIONS

"Office Action of Taiwan Counterpart Application," dated Apr. 9, 2019, p. 1-p. 7.
"Search Report of Europe Counterpart Application", dated Apr. 23, 2019, pp. 1-7.

* cited by examiner

Primary Examiner — Vu A Le
(74) Attorney, Agent, or Firm — JCIPRNET

(57) ABSTRACT

A memory apparatus and a voltage control method of the memory apparatus are provided. The memory apparatus of the invention includes a synchronous circuit, a clock tree and a memory controller. The synchronous circuit receives a reference clock and generating a clock signal. The clock tree is coupled to an output end of the multiplexer and assigns the clock signal to a plurality of signal paths. The memory controller is coupled to the synchronous circuit and controls the synchronous circuit to adjust a frequency of the clock signal according to an operating mode of the memory apparatus.

10 Claims, 3 Drawing Sheets

MEMORY APPARATUS AND VOLTAGE CONTROL METHOD THEREOF

BACKGROUND OF THE INVENTION

1. Field of the Invention

The invention relates to an electronic device, and particularly relates to a memory apparatus and a voltage control method of the memory apparatus.

2. Description of Related Art

In order to save energy, integrated circuit designs using different power modes have been widely adopted. In general, in the normal operating power mode, the operation of a circuit inside the integrated circuit can operate at the maximum operating voltage, while in the power saving power mode, the operating voltage is lowered, so as to achieve the purpose of saving energy. In the field of memory, the clock tree is generally used to transfer the system clock to each component in the integrated circuit. When the memory apparatus switches from the power saving mode to a normal mode to access data, it may take too much time for the lowered power supply voltage of the clock tree in the power saving mode to raise to a voltage locked by a delay locked loop circuit. Since the power supply voltage has a great influence on the performance of the clock tree, the significant voltage drop of the power supply voltage of the clock tree in the power saving mode may cause the system clock fails to raise to an expected voltage in a predetermined time when memory apparatus switches to a normal mode to access data, and which may lead to data access errors.

SUMMARY OF THE INVENTION

The invention is directed to memory apparatus and a voltage control method of the memory apparatus, which are capable of achieving the purpose of saving energy without data access errors.

A memory apparatus of the invention includes a synchronous circuit, a clock tree and a memory controller. The synchronous circuit receives a reference clock and generating a clock signal. The clock tree is coupled to an output end of the multiplexer and assigns the clock signal to a plurality of signal paths. The memory controller is coupled to the synchronous circuit and controls the synchronous circuit to adjust a frequency of the clock signal according to an operating mode of the memory apparatus.

In an embodiment of the invention, when the memory apparatus is in a power saving mode, the memory controller controls the synchronous circuit to lower the frequency of the clock signal.

In an embodiment of the invention, the synchronous circuit includes a delay locked loop circuit, a frequency divider and a multiplexer. The delay locked loop circuit receives the reference clock and generating the clock signal. The frequency divider is coupled to the delay locked loop circuit and divides the clock signal to generate a frequency division signal. The multiplexer is coupled to the memory controller, the delay locked loop circuit and the frequency divider. The memory controller controls the multiplexer to output the clock signal or the frequency division signal to the clock tree according to the operating mode of the memory apparatus.

In an embodiment of the invention, when the memory apparatus is in a power saving mode, the memory controller controls the multiplexer to output the frequency division signal to the clock tree.

In an embodiment of the invention, a frequency of the frequency division signal is half the frequency of the clock signal.

The invention also provides a voltage control method of a memory apparatus. The memory apparatus includes a clock tree. The voltage control method of the memory apparatus includes the following steps. Determine an operating mode of the memory apparatus. Adjust a frequency of a clock signal received by the clock tree according to an operating mode of the memory apparatus.

In an embodiment of the invention, when the memory apparatus is in a power saving mode, the frequency of the clock signal is lowered.

In an embodiment of the invention, the memory apparatus further includes a delay locked loop circuit for generating the clock signal, and the voltage control method of the memory apparatus includes the following steps. Provide a frequency divider to divide the clock signal to generate a frequency division signal. Output the frequency division signal or the clock signal to the clock tree according to the operating mode of the memory apparatus.

In an embodiment of the invention, the voltage control method of the memory apparatus includes a step of outputting the frequency division signal to the clock tree when the memory apparatus is in a power saving mode.

In an embodiment of the invention, a frequency of the frequency division signal is half the frequency of the clock signal.

Based on the above, in the embodiments of the invention, the frequency of the clock signal received by the clock tree is adjusted according to the operating mode of the memory apparatus, so as to reduce power consumption in the power saving mode and reduce the voltage drop of the power supply voltage of the clock tree. Since the voltage drop of the power supply voltage of the clock tree in the power saving mode is reduced (that is, the power supply voltage of the clock tree is stabilized), data access errors of the memory apparatus is avoided when the operating mode of the memory apparatus switched from the power saving mode to the normal mode, and the purpose of saving energy without data access errors is achieved.

Specific embodiments of the invention are disclosed in detail with reference to the following descriptions and the accompanying drawings. The descriptions clearly describe examples in which the principle of the invention is applicable. However, it should be understood that the scope of the embodiments of the invention shall not be limited thereto. The embodiments of the invention may cover various modifications, changes, and equivalents without departing from the spirit and terms of the annexed claims.

The description(s) for an embodiment and/or a disclosed feature(s) may be applied in one or more embodiments in an identical or similar way, combined with a feature in another embodiment, or replace a feature in another embodiment.

It should be noted that, throughout the text, terms such as "comprise/include" refer to the presence of a feature, an assembly, a step, or a component, but do not exclude the presence or addition of another feature, another assembly, another step or another component.

BRIEF DESCRIPTION OF THE DRAWINGS

The accompanying drawings are included to provide a further understanding of the invention, and are incorporated

DESCRIPTION OF THE EMBODIMENTS

Figure 1:
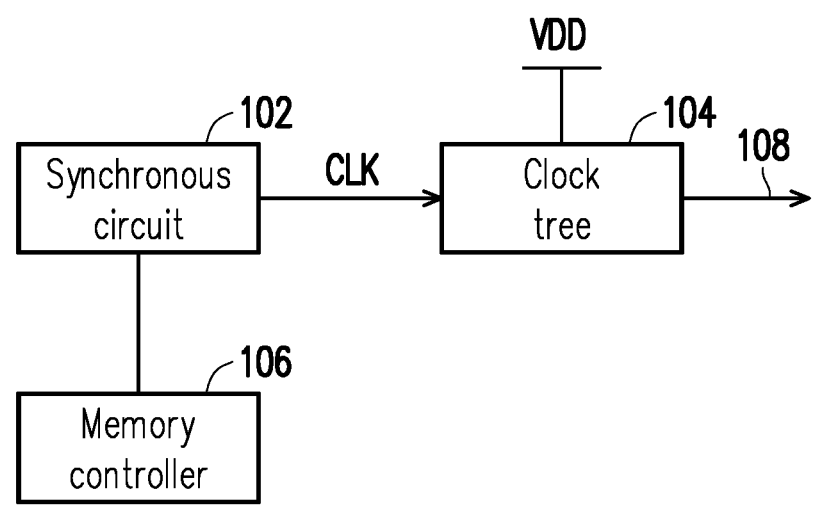
FIG. 1 is a schematic diagram of a memory apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Through the description of the specification, the foregoing and other features of the invention will become clear with reference to the accompanying drawings. The embodiments of the invention are specifically described in the specification and drawings, and such embodiments cover some of the embodiments adopting the principle of the invention. However, it shall be understood that the invention is not limited to the embodiments described herein. Instead, the invention covers all of the modifications, variations, and equivalents falling within the scope of the annexed claims.

FIG. 1 is a schematic diagram of a memory apparatus according to an embodiment of the invention. As shown in FIG. 1, the memory apparatus includes a synchronous circuit 102, a clock tree 104 and a memory controller 106, the synchronous circuit 102 is coupled to the clock tree 104 and the memory controller 106. The synchronous circuit 102 receives a reference clock CLKIN and generate a clock signal CLK. The clock tree assigns the clock signal CLK to a plurality of signal paths 108, so as to provide the clock signal CLK to the components (for example, a memory array, a row decoder circuit, a column decoder circuit, a location register and a control logic circuit, but not limited to) corresponding to the plurality of signal paths. The memory controller 106 controls the synchronous circuit to adjust the frequency of the clock signal CLK received by the clock tree 104 according to the operating mode of the memory apparatus, such that the power consumption can be reduced in the power saving mode and data access errors of the memory apparatus can be avoided when the operating mode of the memory apparatus switched from the power saving mode to the normal mode to access data.

For example, when the memory controller 106 does not receive access command, that is, the memory apparatus is not in the normal mode, the memory apparatus can enter into the power saving mode. When the memory apparatus is in the power saving mode, the memory controller 106 controls the synchronous circuit 102 to lower the frequency of the clock signal CLK received by the clock tree 104. For example, the memory controller 106 may control the synchronous circuit 102 to lower the frequency of the clock signal CLK by one half, which will cause the power supply voltage VDD slightly lowered, for example, lowered to 0.9 times a standard voltage of the power supply voltage VDD in the normal mode. Since the lowered power supply voltage (0.9 VDD) is close to the power supply voltage (VDD) in the normal mode, when the operating mode of the memory apparatus is switched from the power saving mode to the normal mode to access data, the lowered power supply voltage can quickly raise to the standard voltage in the normal mode, and thus the clock signal provided by the clock tree 104 can raise to the expected voltage in the predetermined time to avoid the data access errors.

It is noted that the frequency of the frequency lowered clock signal CLK is not limited to one half the frequency of the clock signal CLK. In other embodiments, the frequency of the frequency lowered clock signal CLK may be reduced to other frequency values.

Figure 2:
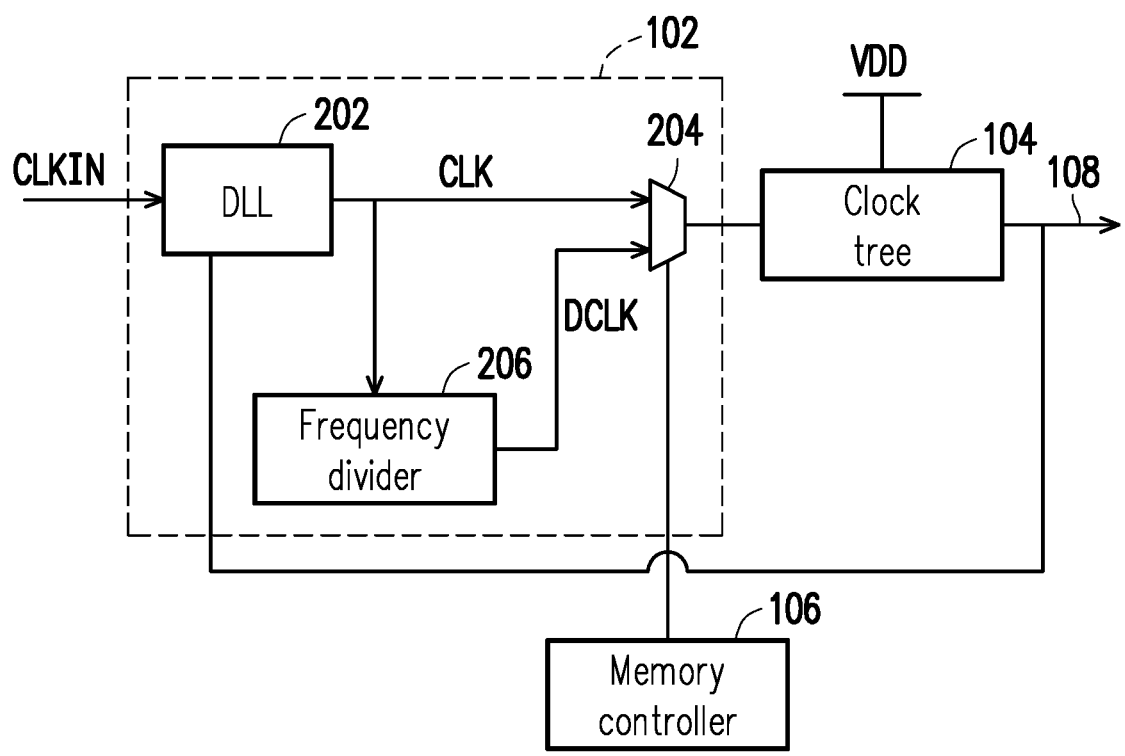
FIG. 2 is another schematic diagram of a memory apparatus according to an embodiment of the invention.

FIG. 2 is another schematic diagram of a memory apparatus according to an embodiment of the invention. In detail, the synchronous circuit 102 in the embodiment of the FIG. 2 includes a delay locked loop (DLL) circuit 202, a multiplexer 204 and a frequency divider 206, the delay locked loop circuit 202 is coupled to a input terminal of the multiplexer 204, the frequency divider 206 are coupled to the delay locked loop circuit 202 and the other input terminal of the multiplexer 204, the control terminal of the multiplexer 204 is coupled to the memory controller 106, and the output terminal of the multiplexer 204 is coupled to the clock tree 104. The delay locked loop circuit 202 generates the clock signal CLK to the multiplexer 204 according to the reference clock CLKIN and a feedback signal FB1 output by the clock tree 104. The frequency divider 206 divides the clock signal to generate a frequency division signal DCLK to the multiplexer 204, the frequency of the frequency division signal DCLK is, for example but not limited to, a quarter of the frequency of the clock signal. The memory controller 106 controls the multiplexer 204 to output the clock signal CLK or the frequency division signal DCLK to the clock tree 104 according to the operating mode of the memory apparatus. For example, when the memory apparatus is in the power saving mode, the memory controller 106 controls the multiplexer 204 to output the frequency division signal DCLK, so as to reduce power consumption. When the memory apparatus switches from the power saving mode to the normal mode to access data, the memory controller 106 controls the multiplexer 204 to output the clock signal CLK, since the voltage drop of the power supply voltage is small (for example, the power supply voltage VDD is lowered to 0.95 times the standard voltage of the power supply voltage VDD in the normal mode) due to the lowered clock signal CLK (i.e. the frequency division signal DCLK), the power supply voltage VDD of the clock tree 104 is able to quickly raise to the standard voltage locked by the delay locked loop circuit 202 when the memory apparatus switches from the power saving mode to the normal mode to access data, and thus the clock signal provided by the clock tree 104 can raise to the expected voltage in the predetermined time to avoid the data access errors.

Figure 3:
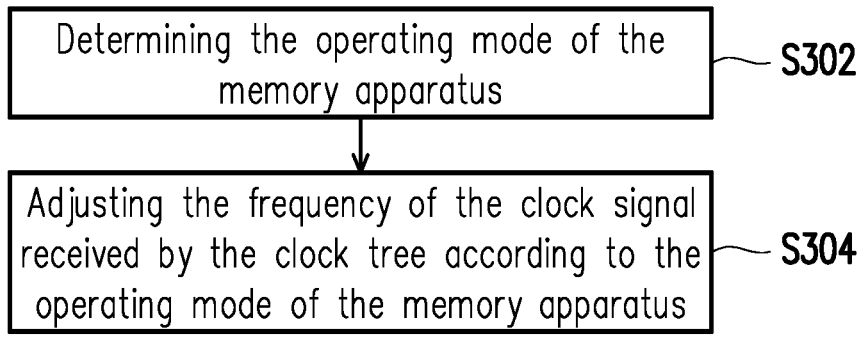
FIG. 3 is a flowchart of a voltage control method of a memory apparatus according to an embodiment of the invention.
Figure 4:
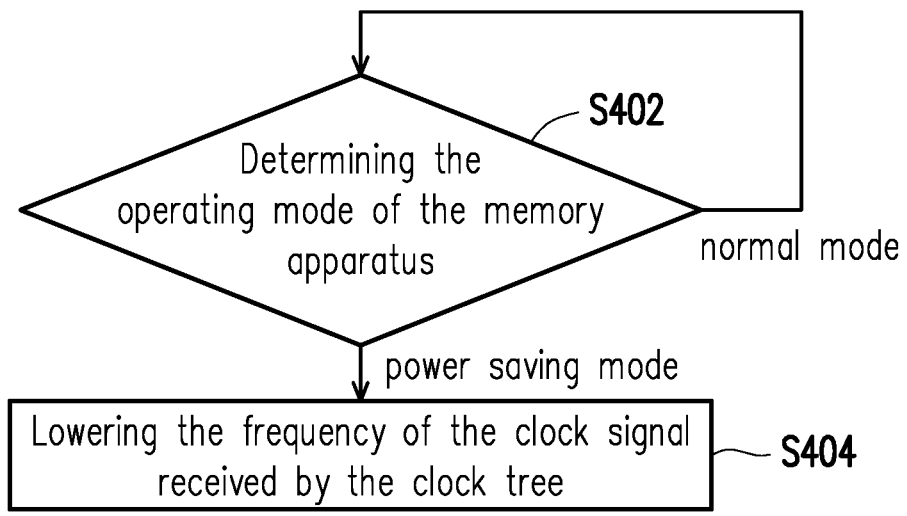
FIG. 4 is another flowchart of a voltage control method of a memory apparatus according to an embodiment of the invention.

FIG. 3 is a flowchart of a voltage control method of a memory apparatus according to an embodiment of the invention. Referring to FIG. 3, according to the aforementioned embodiment, it is known that the voltage control method of a memory apparatus includes following steps. First, determine an operating mode of the memory apparatus (step S302). Then, adjusting the frequency of the clock signal received by the clock tree according to an operating mode of the memory apparatus (step S304). For example, as shown in FIG. 4, when the memory apparatus is determined in the normal mode in step S402, continue to perform the step S402. On the contrary, when the memory apparatus is determined in the power saving mode in step S402, the frequency of the clock signal is lowered (step S404), for example but not limited to; lowered to a half of the frequency of the clock signal, so as to reduce voltage drop of the power supply voltage of the clock tree in the power saving mode. Therefore, when the operating mode of memory apparatus is switched from the power saving mode into normal mode to access data, the lowered power supply voltage can be quickly raised to the standard voltage in the normal mode, and thus the clock signal provided by the clock tree 104 can be raised to the expected voltage in the predetermined time to avoid the data access errors. In some embodiment, the step S304 may include providing a frequency divider to divide the clock signal to generate a frequency division signal and outputting the frequency division signal or the clock signal to the clock tree according to the operating mode of the memory apparatus. Similarly, the step S404 may include providing a frequency divider to divide the clock signal to generate a frequency division signal and outputting the frequency division signal to the clock tree.

In summary, based on the embodiments of the invention, the frequency of the clock signal received by the clock tree is adjusted according to the operating mode of the memory apparatus, so as to reduce power consumption in the power saving mode and reduce the voltage drop of the power supply voltage of the clock tree. Since the voltage drop of the power supply voltage of the clock tree in the power saving mode is reduced (that is, the power supply voltage of the clock tree is stabilized), data access errors of the memory apparatus is avoided when the operating mode of the memory apparatus switched from the power saving mode to the normal mode, and the purpose of saving energy without data access errors is achieved.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A memory apparatus, comprising:
   a synchronous circuit, receiving a reference clock and generating a clock signal; and
   a clock tree, coupled to an output end of a multiplexer, receiving a clock signal and a power supply voltage, generating a first clock signal according to the clock signal and the power supply voltage, and assigning the first clock signal to a plurality of signal paths; and
   a memory controller, coupled to the synchronous circuit, controlling the synchronous circuit to adjust a frequency of the clock signal according to an operating mode of the memory apparatus.

2. The memory apparatus as claimed in claim 1, wherein when the memory apparatus is in a power saving mode, the memory controller controls the synchronous circuit to lower the frequency of the clock signal.

3. The memory apparatus as claimed in claim 1, wherein the synchronous circuit comprising:
   a delay locked loop circuit, receiving the reference clock and generating the clock signal;
   a frequency divider, coupled to the delay locked loop circuit, dividing the clock signal to generate a frequency division signal; and
   the multiplexer, coupled to the memory controller, the delay locked loop circuit and the frequency divider, wherein the memory controller controls the multiplexer to output the clock signal or the frequency division signal to the clock tree according to the operating mode of the memory apparatus.

4. The memory apparatus as claimed in claim 3, wherein when the memory apparatus is in a power saving mode, the memory controller controls the multiplexer to output the frequency division signal to the clock tree.

5. The memory apparatus as claimed in claim 3, wherein a frequency of the frequency division signal is half the frequency of the clock signal.

6. A voltage control method of a memory apparatus, wherein the memory apparatus comprises a clock tree, and the clock tree receives a clock signal and a power supply voltage, generates a first clock signal according to the clock signal and the power supply voltage, and assigns the first clock signal to a plurality of signal paths, the voltage control method of the memory apparatus comprising:
   determining an operating mode of the memory apparatus; and
   adjusting a frequency of a clock signal received by the clock tree according to an operating mode of the memory apparatus.

7. The voltage control method of the memory apparatus as claimed in claim 6, wherein when the memory apparatus is in a power saving mode, the frequency of the clock signal is lowered.

8. The voltage control method of the memory apparatus as claimed in claim 6, wherein the memory apparatus further comprises a delay locked loop circuit for generating the clock signal, the voltage control method of the memory apparatus comprising:
   providing a frequency divider to divide the clock signal to generate a frequency division signal; and
   outputting the frequency division signal or the clock signal to the clock tree according to the operating mode of the memory apparatus.

9. The voltage control method of the memory apparatus as claimed in claim 8, comprising:
   outputting the frequency division signal to the clock tree when the memory apparatus is in a power saving mode.

10. The voltage control method of the memory apparatus as claimed in claim 8, wherein a frequency of the frequency division signal is half the frequency of the clock signal.

* * * * *